United States Patent [19]
Raab et al.

[11] 3,988,920
[45] Nov. 2, 1976

[54] METHOD FOR DETECTING A LEAK IN A REACTION TUBE WHEN FORMING A IIIA-VB COMPOUND

[75] Inventors: Günter Raab, Erlangen; Klaus Zeuch, Eckental, both of Germany

[73] Assignee: Siemens Aktiengesellschaft, Munich, Germany

[22] Filed: Mar. 24, 1975

[21] Appl. No.: 561,341

[30] Foreign Application Priority Data

Mar. 27, 1974 Germany............................ 2414788

[52] U.S. Cl..................................... 73/40.7; 73/49.3; 23/230 L

[51] Int. Cl.[2]...................... G01M 3/06; G01M 3/34

[58] Field of Search ............... 73/40, 40.7, 49.3, 52, 73/DIG. 11; 23/230 L, 232 R, 254 R; 116/114 AC, 114 F, 114 N, 114 P; 250/573; 356/207

[56] References Cited

UNITED STATES PATENTS

| | | | |
|---|---|---|---|
| 1,933,791 | 11/1933 | Crouch | 23/230 L |
| 2,374,762 | 5/1945 | McNitt | 356/207 X |
| 2,708,896 | 5/1955 | Smith et al. | 116/114 |
| 3,406,017 | 10/1968 | Canning | 23/232 R |
| 3,572,085 | 3/1971 | Packo | 73/40.7 X |
| 3,598,532 | 8/1971 | Adams et al. | 73/40.7 X |

OTHER PUBLICATIONS

"The Preparation and Floating Zone Processing of Gallium Phosphide;" Frosch & Derick, Journal of Electrochemical Society, vol. 108, p. 251 (1961).

*Primary Examiner*—Richard C. Queisser
*Assistant Examiner*—John S. Appleman
*Attorney, Agent, or Firm*—Kenyon & Kenyon Reilly Carr & Chapin

[57] ABSTRACT

In an apparatus for the preparation of compounds in which one of the components is a highly volatile reactive component, in particular when preparing gallium phosphide, under pressure in an ampoule located in a pressure vessel, between 0.5 and 25% by volume and preferably 1.5 to 3% by volume of a gas capable of reacting with the highly volatile component, such as oxygen, air or carbon dioxide, is mixed in the pressure vessel to the gas which is used for pressurizing and as a cooling medium and the pressure in the pressure vessel is matched to the internal pressure of the ampoule in which the reaction is taking place.

8 Claims, 2 Drawing Figures

METHOD FOR DETECTING A LEAK IN A REACTION TUBE WHEN FORMING A IIIA-VB COMPOUND

BACKGROUND OF THE INVENTION

This invention relates to the preparation of compounds or alloys particularly those used in semiconductors such as gallium phosphide in general and more particularly to an improved mehtod of detecting a leak in the reaction ampoule in which the preparation is taking place and shuting down the process upon such detection.

In the preparation of compounds and alloys of this nature such as gallium phosphide and which will typically include one component which is highly volatile reactive component the preparation is very often carried out in a closed system, the reaction is carried out within a closed quartz vessel referred to as a reaction tube or an ampoule. This may be necessary for reasons of purity and because of the inertness of the vessel materials being used. During the reaction in preparing the compound or alloy a vapor pressure will be built up within the ampoule because of the highly volatile component. Because of this it is desireable and sometimes necessary to place the reaction tube within an autoclave or pressure vessel and to apply to its outside walls a pressure which corresponds to the internal pressure so that the differential pressure acting on the walls of the reaction ampoule will be minimized.

A procedure of this nature has been previously described by Frosch and Derick in the Journal of Electrochemical Society, Vol. 108, pg. 251 (1961). In the disclosed process for the synthesis of polycrystalline gallium phosphide from the two elements the synthesis is carried out in a closed reaction tube or ampoule with the outside of the tube having a counter pressure applied thereto which is approximately the magnitude of the internal ampoule pressure. This pressure is obtained through the use of an inert gas within a pressure vessel and permits using quartz ampoules which are commercially available, i.e. quartz ampoules of relatively small wall thickness.

Improved methods and apparatus for carrying out such a process and greater detail regarding the process is given in Application Ser. Nos. 559,015, and 559,016, and 559,014 all filed on Mar. 17, 1975 and assigned to the same assignee as the present invention.

The fabrication of the quartz ampoule in such a process can be simply carried out. The charged ampoule, i.e. the ampoule after having the elements placed therein, can be sealed off using an oxygen-hydrogen torch. After placing the two elements in the ampoule a sealing cap or sealing block is inserted after which the ampoule is evacuated to a pressure of about $10^{-5}$ Torr. The wall of the ampoule is then fused to the sealing cap using the oxygen-hydrogen torch. This is a well known sealing process and results in a vacuum tight and pressure tight closure of the ampoule. The types of ampoules which may be used and additional information regarding the sealing process is given in application Ser. No. 561,342 filed on even date herewith and assigned to the same assignee as the present invention.

Although excellent seals are obtained there are occasions when the seals do not withstand the stress at high temperature which can last for several hours during the synthesis. They do not remain tight, since, for example, thermal stresses in the quartz glass, caused by the sealing process, cannot be annealed by tempering, since this would represent a considerable cost factor. As a result, should a break occur in the ampoule at its seal or in any other area the reaction element or elements which are volatile at the reaction temperature can escape from the ampoule and react, for example, with the heater windings of the resistance furnaces used in the apparatus or can condense at cool surfaces and lead to undesireable consequences such as the ignition of white phosphorus in air when the pressure vessel is opened. Furthermore, because the volatile reaction component escapes from the leaky ampoule, it is not available to carry out a complete reaction. As a result, when such leakage occurs the reaction should be immediately interrupted. However, it is not possible under normal circumstances to directly observe the seal and detect such cracks. Consequently, the damage can already have taken place before the leak is recognized. This has been found to be a particular problem in the preparation of polycrystalline AIII–BV compounds. In particular, compounds with one or more volatile components such as As, P, and S exhibit problems.

In view of this it is evident that there is a need to be able immediately to detect a leak in such a system and upon such detection shut down the system.

SUMMARY OF THE INVENTION

The present invention provides such a method. To accomplish this, the method of the present invention comprises adding between 0.5 and 25% by volume, preferably 1.5 to 3% by volume of a gas capable of reacting with highly volatile components of the synthesis to the inert gas in the pressure vessel. Oxygen is particularly suitable as the reacting gas and may be in the form of pure oxygen, the oxygen in air or the oxygen in carbon dioxide. Furthermore, as a second step, the pressure in the pressure vessel is adjusted to be essentially equal to the presure inside the ampoule.

In accordance with the preferred embodiment air can be used as the gas in a very simple fashion by using the air within the pressure vessel prior to charging with the inert gas under pressure.

DETAILED DESCRIPTION OF THE PREFERRED EMBODIMENT

Figure 1:
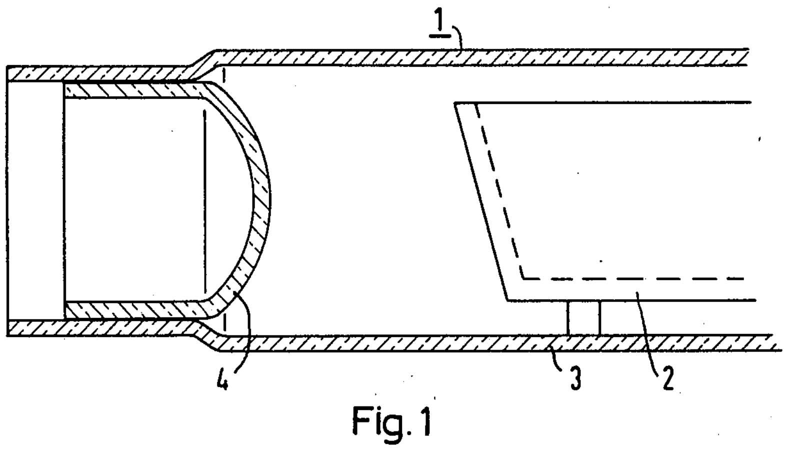
FIG. 1 is a cross sectional view of a reaction ampoule helpful in understanding how and where a break might occur.

FIG. 1 is cross sectional view illustrating a typical reaction ampoule 1. Within the reaction ampoule 1 is a reaction boat 2 which will contain one component of the compound being produced. Typically the boat 2 will be made of graphite or boron nitride. Once the reaction component therein along with the other reaction component are loaded, as more fully described in the aforementioned co-pending applications, a sealing cap or sealing block 4 is inserted in the open end of the ampoule. Thereupon the ampoule is evacuated to a vacuum of approximately $10^{-5}$ Torr after which the sealing cap 4 is sealed into place using an oxy-hydrogen torch or the like. However due to the thermal stresses to which the ampoule is subjected during the process breaks may occur at the point of sealing between the sealing cap 4 and the wall 3 of the ampoule or, in some cases, may occur directly in the wall 3 of the ampoule. Under such circumstances the highly volatile compound such as phosphorus, arsenic or sulfur will escape through the crack into the pressure vessel in which the ampoule is contained and can result in the deleterious effects noted above.

Figure 2:
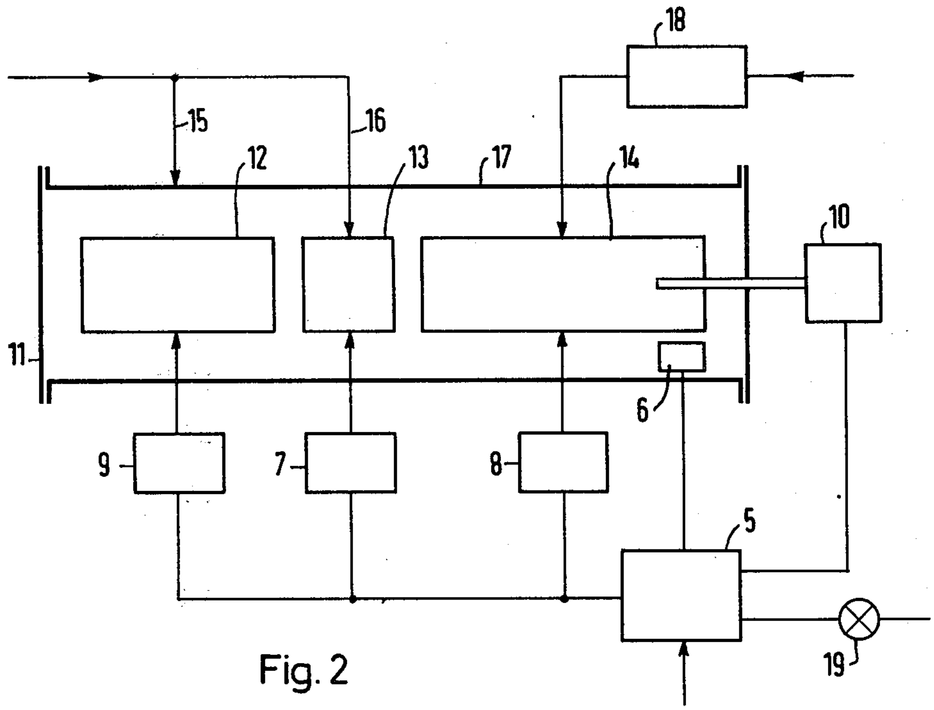
FIG. 2 is a block diagram of a system according to the present invention including means for detecting a leak.

FIG. 2 is a block diagram illustrating a synthesis system employing the method and apparatus of the present invention. Disposed within a pressure vessel or autoclave 11 are an after heating oven 12, high frequency heating means 13 and a phosphorus oven 14. The reaction ampoule 1 extends with its ends in the phosphorus oven and after heating oven 12 with a narrow reaction zone formed by the high frequency heating divice 13, typically a high frequency coil which is inductively coupled to the boat 2 shown on FIG. 1. Means such as a feed drive 10 are provided to move the ampoule 1 through the reaction zone established by the high frequency heating means 13. This is all described in much more detail in the aforementioned co-pending applications. Also shown on the Figure is a water supply circuit having branches 15 and 16. The branch 15 is used for cooling the jacket of the pressure vessel or autoclave 11 and the branch 16 for cooling the high frequency heating device 13. A gas under pressure is maintained within the pressure vessel 11. It is supplied through a pressure control 18 to be described in more detail below. In the prior art such a gas was typically an inert gas such as nitrogen or helium.

In accordance with the present invention a gas which will react with the highly volatile element in the synthesis must be added to the inert gas. It is preferred, that the gas be oxygen or a gas containing oxygen or an oxygen dispensing substance. This oxygen should be present in the range of 0.5 to 25% by volume and preferably 1.5 to 3% by volume. Although it is possible to mix oxygen with the pressure medium being supplied through the pressure control or supply carbon dioxide within the reaction vessel 11, preferably in the form of dry ice, the most advantageous manner of obtaining the required amount of oxygen is through the use of air. This can be simply done by using the air which is within the pressure vessel before charging. In other words,, before starting the process the pressure vessel will be opened to the ambient atmosphere and will contain air in a volume corresponding to the volume of the pressure vessel. The pressure vessel is then sealed. Rather than purging the pressure vessel of the air contained therein, the air is allowed to remain and the pressure medium such as nitrogen then admitted whereupon it will mix with the air. As a result, there is no need to provide apparatus for evacuating the pressure vessel 11, the cooling effect of the pressure medium is not substantially reduced and at the same time the necessary oxygen is present within the vessel. Operations in the vessel are typically carried out in the vicinity of 10 bar. Assuming 20% oxygen in the air at atmospheric pressure, when sufficient nitrogen is added to raise the pressure to 10 bar, it will be recognized that a percentage of oxygen of approximately 2% will result through this process, i.e. essentially an amount in the middle of the preferred range. With this amount of oxygen in the pressure vessel, and assuming that phosphorus is the volatile reaction component, any phosphorus leaking will react with the oxygen to form phosphorus pentoxide [$P_2O_5$] which will be noted by the appearance of fog and very soon by the condensation of droplets at cooled places, i.e. at the inspection window of the pressure vessel. Although, visual observation can be used to detect such leaks and the apparatus shut down manually, it is preferable that some automatic means for shuting down the process be used.

Furthermore, in accordance with the present invention, the pressure within the pressure vessel should be maintained at essentially the pressure within the reaction ampoule 1. FIG. 2 illustrates the various detectors and circuits used to carry out the necessary detection and to maintain the required pressures and temperatures.

As will be recognized by those skilled in the art and as is more fully explained in the aforementioned copending applications the ovens 12 and 14 and the high frequency heating device 13 must keep their respective zones at a predetermined temperature in order that the reaction be properly carried out. To detect the phosphorus temperature a temperature sensor such as thermocouple 21 is inserted into a measuring tube in the ampoule as described in great detail in application Ser. No. 561,342. As disclosed therein, the pressure inside the ampoule 1 will be almost completely determined by the phoshphorus pressure. The phosphorus vapor pressure in turn is a direct function of the phosphorus temperature. Thus, the temperature sensed by the temperature sensor 21 will be a measure of both the temperature at the phosphorus oven and the pressure inside the ampoule 1. This temperature sensor output is provided to a temperature measuring circuit 23 which may be a conventional bridge circuit or the like with a suitably amplified output for use as a control signal. The output signal from the temperature circuit 23 i.e. a quantity proportional to the phosphorous oven temperature and to the pressure inside the ampoule, is provided to a controller 8 for the phosphorus oven and to a pressure control 18 for the pressure medium. The pressure control 18 will be of conventional design and can include a servo driven pressure regulating valve. Such arrangements are well known in the art with the input signal from the temperature circuit 23 being used as an input to the servo system to adjust the pressure regulating valves to a pressure corresponding to the pressure in the ampoule. In this way, the pressure both inside and outside the ampoule can be maintained essentially equal. The same output is provided to the controller 8 which can be a proportional integral controller; that is to say, it can be a controller employing an intergrating operational amplifier with the actual value input from the temperature circuit 23 compared with a preset value corresponding to the desired temperature at the input to the integrator. The integrator will increase its output until the actual value fed back from the temperature circuit matches the desired value at which point the integrator will maintain the constant output value which is provided to the phosphorus oven. For example, the output of such a controller can be used to drive an amplifier which will provide a corresponding current through the oven heater coils. In this manner, the phosphorus temperature will be maintained at the desired level. In similar fashion, a temperature sensor 25 can be inserted in the vicinity of the afterheating oven with a temperature circuit 27 used to provide an actual value output to the controller 9 for the afterheating oven. Although the sensor 21 was indicated as being a thermocouple it should be recognized that it can also be a temperature sensitive resistance element such as a thermistor as can the temperature sensor 25. The controller 9 will be essentially the same as the controller 8. The temperature at the reaction zone in the ampoule 1, which results from the high frequency heating coil 13, can be monitored in the manner disclosed in the aforementioned application Ser. No. 559,016. That is to say, a light pipe or fiber optic is placed below the boat 2 of FIG. 1 and transmits the light to a circuit 29 which can include appropriate photo elements to provide an amplified electrical output proportional to the light level from the heated boat and, thus, proportional to the temperature. This signal output from the temperature circuit 29 is then provided to a controller 7 for controlling the current through the high frequency heating coil. It too can be a proportional integral controller providing its output to a high frequency generator to control the amplitude thereof in conventional fashion. Also disposed within the pressure vessel 11 is a detector 6 for detecting a leak. Detector 6 can comprise, essentially, a smoke or vapor detector of the type typically used to detect smoke, fog or the like. In essence, it will comprise a light source and photo cell which will thus change its output should a fog of phoshorus pentoxide or the like appear within the pressure vessel. This output is provided to a disabling circuit 5. Typically such a disabling circuit 5 could include a comparator having as one input the output of the detector 6, i.e. the photo detector output and adapted to change its output state should the input from the detector 6 fall below a certain level. In response to such a change, indicating a leak in the ampoule 1, the disabling circuit acts to disable the controllers 7, 8, 9 and the feed drive 10. A simple manner implementing this is to provide the power to each of the controllers 7, 8, and 9 and to the feed drive through relay contacts in the disabling circuit. The relay will be held closed as long as the comparator output stays in a state indicating no fog within the pressure vessel. However, upon a change in state from the comparator the relay will be caused to open its contacts interrupting the power to all of the controllers and the feed drive thereby stopping the process. However, the pressure control and cooling water are not affected by this. As a result, as the ampoule cools down, the pressure control will continue to maintain the proper pressure equalization between the inside and outside of ampoule with the cooling water acting to gradually cool down the apparatus until it reaches ambient temperature. Since many systems of this nature are operated automatically such an automatic detection and disabling becomes particularly necessary. In addition to shutting down the system, an additional relay contact can be used to provide an output to an alarm 19 in the form of an indicator light, horn etc.

Whichever highly volatile component is being used in the process, a suitable fog will result to activate the detector 6. Thus, when using phosphorus, phosphorus pentoxide will be formed. If arsenic is the component $As_2O_3$ will be produced and when sulphur is the component $SO_2$ will be produced. The method is particularly well suited when preparing polycrystalline dense gallium phosphide, indium phosphide and gallium arsenide. These materials are used in semiconductors, the dense material being used for growing single crystals.

Thus, through the use of the method and apparatus of the present invention, a reaction for forming one of these compounds can be immediately interrupted without any damage to the installation when the pressure vessel is opened and saving time in the process. Although a specific embodiment has been illustrated and described, it will be obvious to those skilled in the art that various modifications may made without departing from the spirit of the invention which is intended to be limited solely by the appended claims.

We claim:

1. A method of detecting leaks in a reaction ampoule containing components such as the components of an AIII-BIV compound, at least one of which components is a volatile component which will react, particularly the components As, P and S, the ampoule being held under pressure in a pressure vessel for carrying out a synthesis of the compound comprising the steps of:

a. pressurizing the pressure vessel with a gas mixture which includes a gas in an amount between 0.5 and 25% by volume, which is capable of reacting with the highly volatile components to form a visible fog b. maintaining the pressure in the pressure vessel at essentially the pressure within said ampoule; and c. observing the inside of the pressure vessel for the presence of a fog, such presence indicating that a leak has occurred.

2. The method according to claim 1 wherein the volume of said gas capable of reacting is between 1.5 and 3%.

3. The method according to claim 1 wherein said reacting gas is one of the group consisting of oxygen and an oxygen dispensing compound with the remaining gas in said vessel being an inert gas, and wherein when using an oxygen dispensing compound, the volume of said compound is that corresponding to a volume of oxygen in the range of 0.5 to 25%.

4. The method according to claim 3 wherein said gas mixture is air.

5. The method according to claim 3 wherein said reacting gas is carbon dioxide obtained by sublimating dry ice.

6. The method according to claim 3 wherein said reacting gas comprises the air in the pressure vessel prior to pressurizing and wherein an inert gas is added to said air to reach the desired pressure.

7. The method according to claim 6 wherein the reaction components in said ampoule are gallium and phosphorus, the pressure inside said ampoule is 10 bar and the pressure in said pressure vessel is 10 bar, thereby resulting in a content of approximately 2% by volume of oxygen.

8. The method according to claim 1 wherein said step of observing is accomplished using a fog detecting mechanism.

* * * * *

UNITED STATES PATENT AND TRADEMARK OFFICE

CERTIFICATE OF CORRECTION

PATENT NO. : 3988920

DATED : November 2, 1976

INVENTOR(S) : GÜNTER RAAB ET AL

It is certified that error appears in the above-identified patent and that said Letters Patent are hereby corrected as shown below:

In the title: delete "IIIA-VB"

Col. 1, line 10: change "mehtod" to --method--;

Col. 1, line 12: change "shuting" to --shutting--;

Col. 2, line 39: change "presure" to --pressure--;

Col. 3, line 16: change "divice" to --device--;

Col. 4, line 5: change "shuting" to --shutting--;

Col. 5, line 22: change "phosorus" to --phosphorus--;

Col. 6, line 17 (claim 1): delete "AIII-BIV" and insert therefor --AIII-BV--.

Signed and Sealed this

Twenty-sixth Day of April 1977

[SEAL]

*Attest:*

RUTH C. MASON
*Attesting Officer*

C. MARSHALL DANN
*Commissioner of Patents and Trademarks*